(12) United States Patent
Dutta

(10) Patent No.: US 9,935,217 B1
(45) Date of Patent: Apr. 3, 2018

(54) HIGH EFFICIENCY PHOTOVOLTAIC CELLS AND MANUFACTURING THEREOF

(71) Applicant: Achyut Kumar Dutta, Sunnyvale, CA (US)

(72) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 14/315,308

(22) Filed: Jun. 25, 2014

Related U.S. Application Data

(62) Division of application No. 11/555,445, filed on Nov. 1, 2006, now Pat. No. 8,816,191.

(60) Provisional application No. 60/597,419, filed on Nov. 29, 2005.

(51) Int. Cl.
| | |
|---|---|
| *H01L 31/0352* | (2006.01) |
| *H01L 31/068* | (2012.01) |
| *H01L 31/0236* | (2006.01) |
| *H01G 9/20* | (2006.01) |

(52) U.S. Cl.
CPC ..... *H01L 31/02366* (2013.01); *H01G 9/2059* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,150,999 A | * | 9/1964 | Rudenberg | H01L 31/0236 136/256 |
| 4,110,122 A | * | 8/1978 | Kaplow | H01L 31/068 136/246 |
| 4,135,950 A | * | 1/1979 | Rittner | H01L 31/022425 136/255 |
| 4,227,942 A | * | 10/1980 | Hall | H01L 31/02245 136/255 |
| 4,251,679 A | * | 2/1981 | Zwan | H01L 31/04 136/244 |
| 4,379,944 A | * | 4/1983 | Borden | H01L 31/0236 136/246 |
| 4,406,913 A | * | 9/1983 | Weyrich | 136/259 |
| 4,427,839 A | * | 1/1984 | Hall | H01L 31/022458 136/255 |
| 6,127,623 A | * | 10/2000 | Nakamura | H01L 31/0236 136/256 |
| 6,541,696 B2 | * | 4/2003 | Washio | H01L 31/022433 136/255 |
| 2002/0172820 A1 | * | 11/2002 | Majumdar | B82Y 10/00 428/357 |
| 2004/0109666 A1 | * | 6/2004 | Kim, II | F24J 2/067 385/147 |
| 2006/0207647 A1 | * | 9/2006 | Tsakalakos | B82Y 20/00 136/256 |

(Continued)

*Primary Examiner* — Golam Mowla

(57) ABSTRACT

Novel structures of photovoltaic cells are provided. The cells are based on nanometer or micrometer-scaled wires, tubes, and/or rods, which are made of electronic materials covering semiconductors, insulators, and may be metallic in structure. These photovoltaic cells have large power generation capability per unit physical area over the conventional cells. These cells will have enormous applications such as in space, commercial, residential and industrial applications.

12 Claims, 12 Drawing Sheets

(56) References Cited

U.S. PATENT DOCUMENTS

2008/0047604 A1* 2/2008 Korevaar ............... B82Y 20/00
   136/258
2010/0078055 A1* 4/2010 Vidu et al. ................... 136/244

* cited by examiner

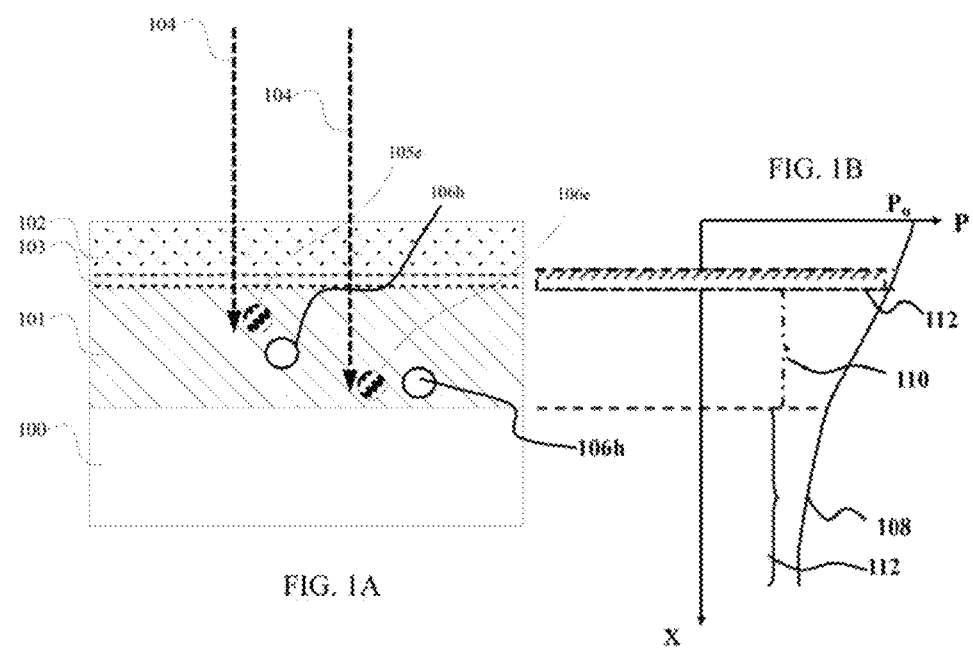

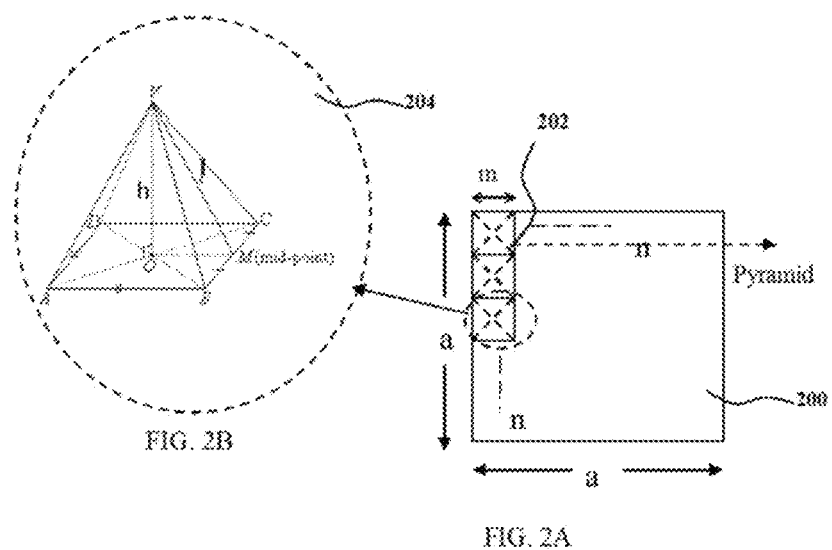
FIG. 2A
FIG. 2B
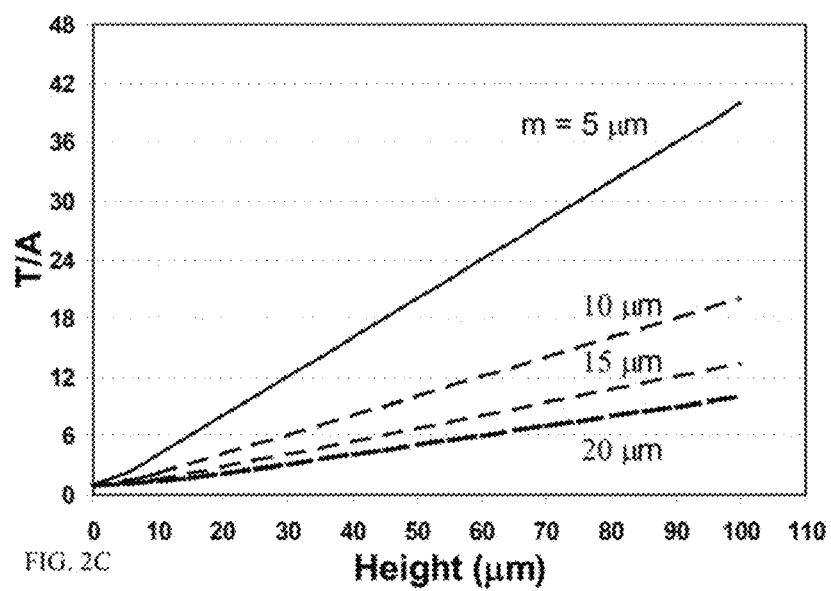
FIG. 2C

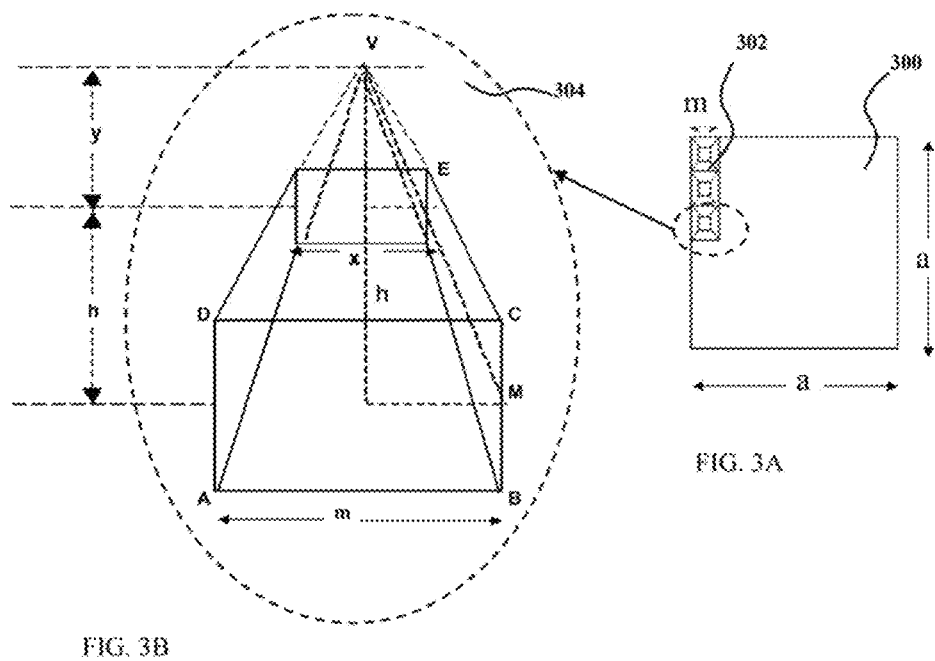
FIG. 3A
FIG. 3B
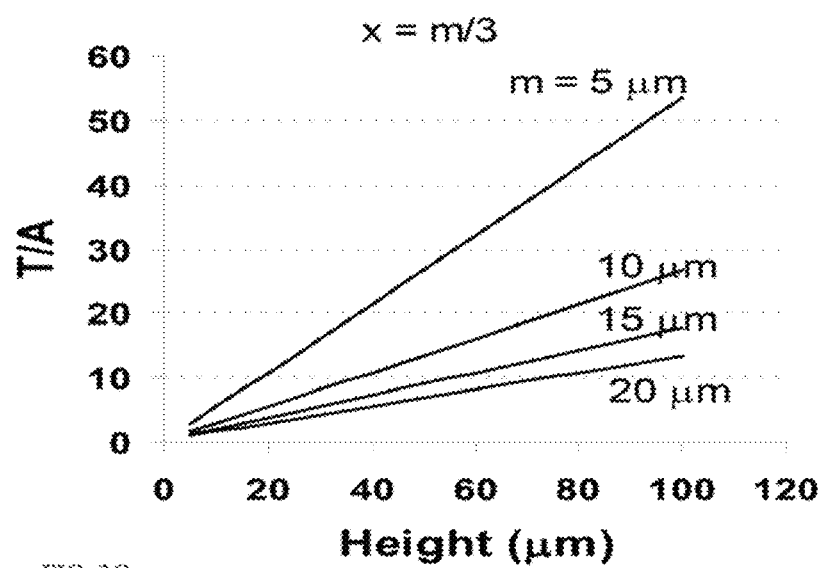
FIG. 3C

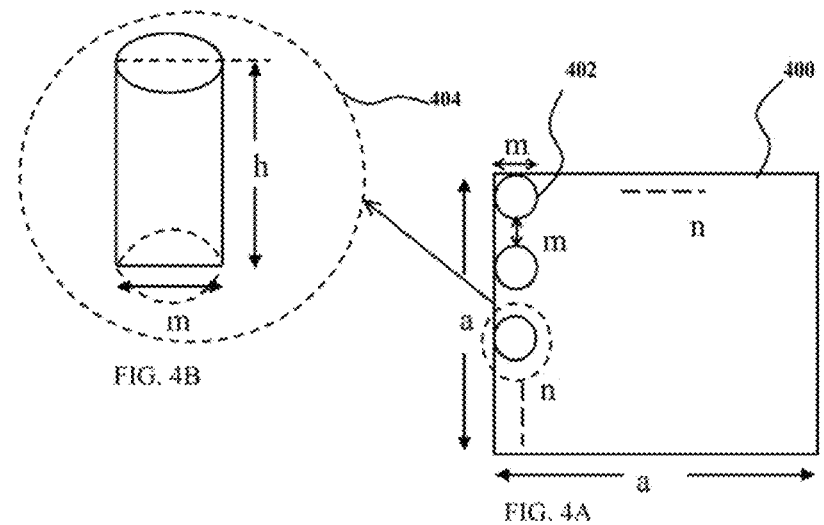
FIG. 4B
FIG. 4A
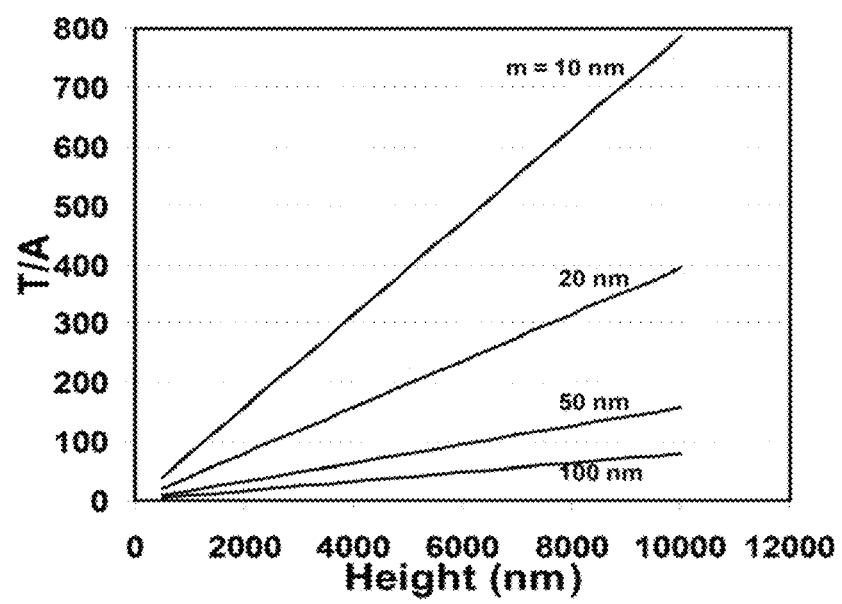
FIG. 4C

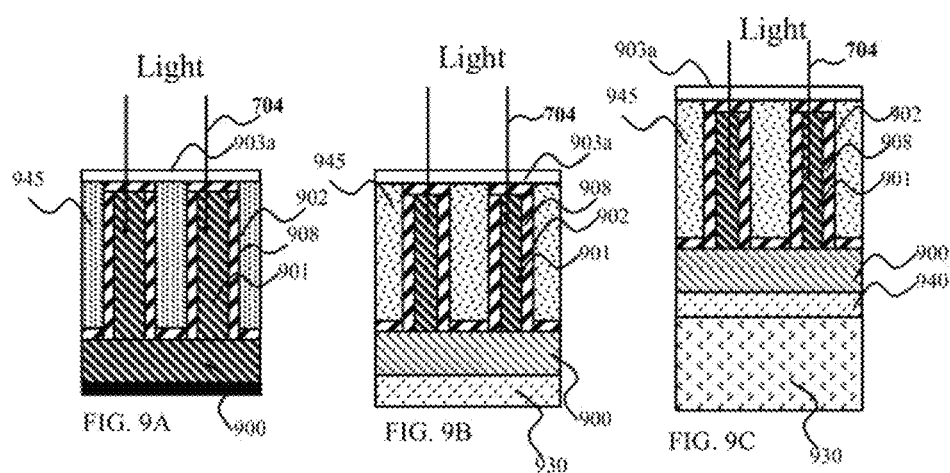
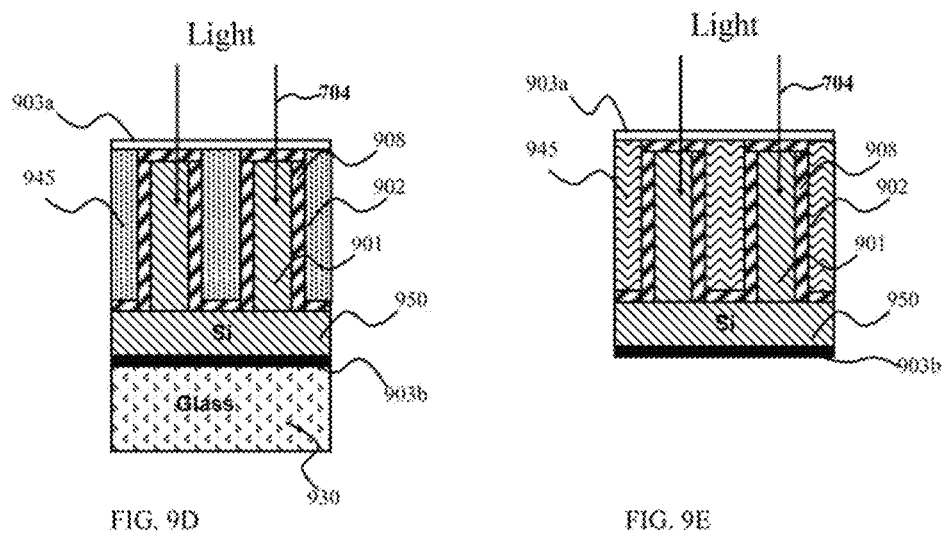

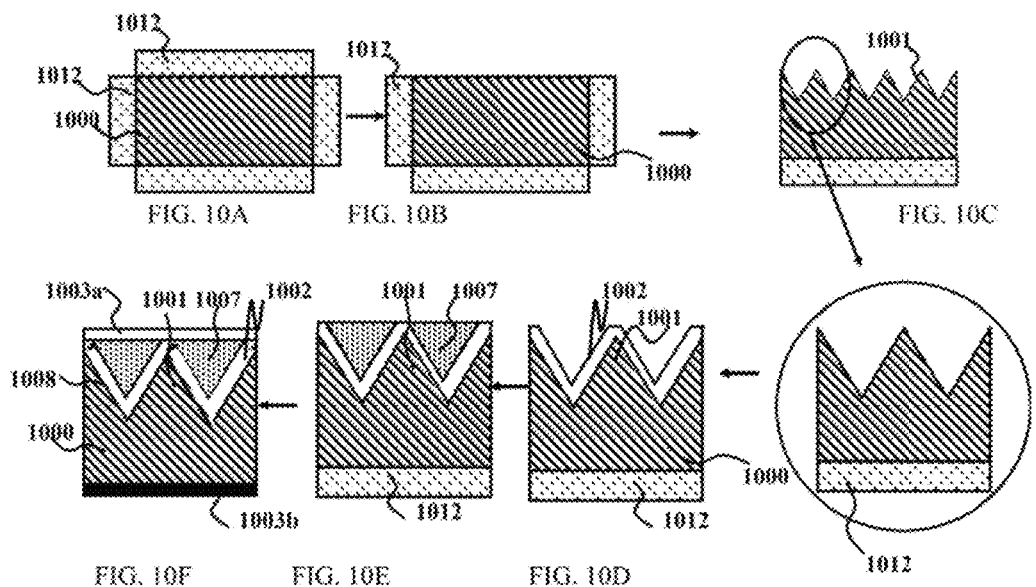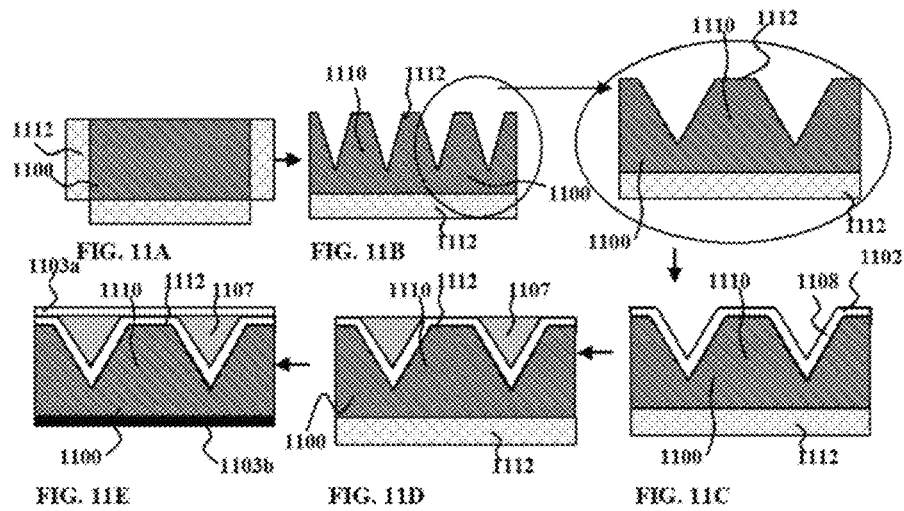

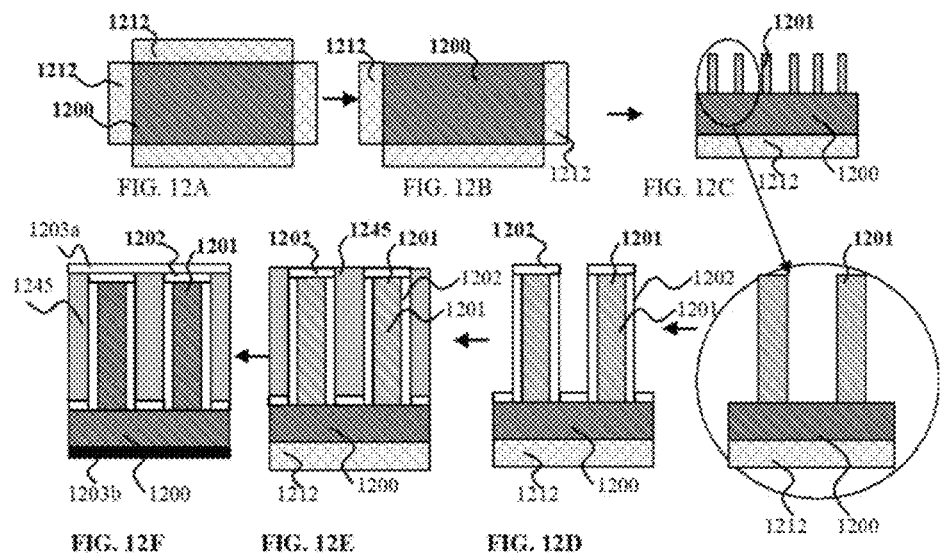
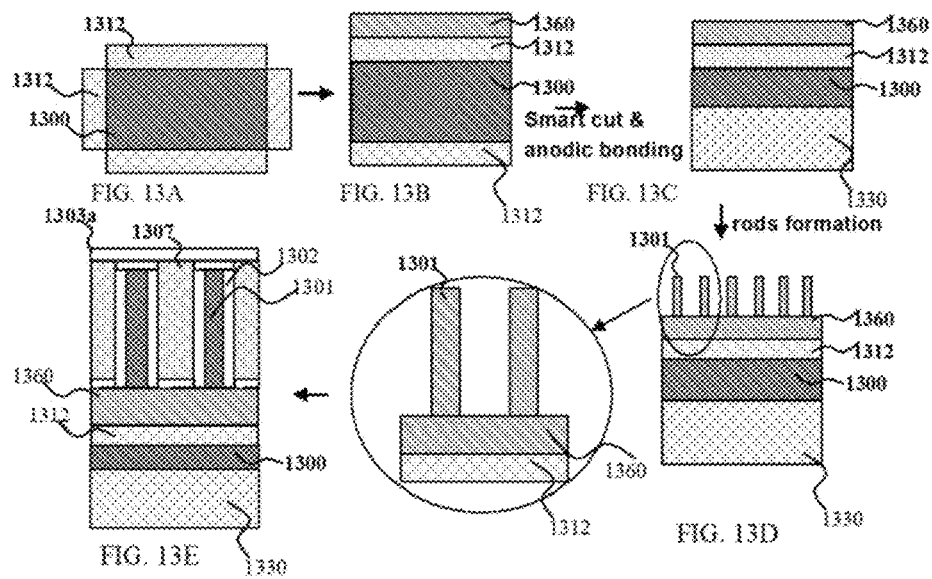

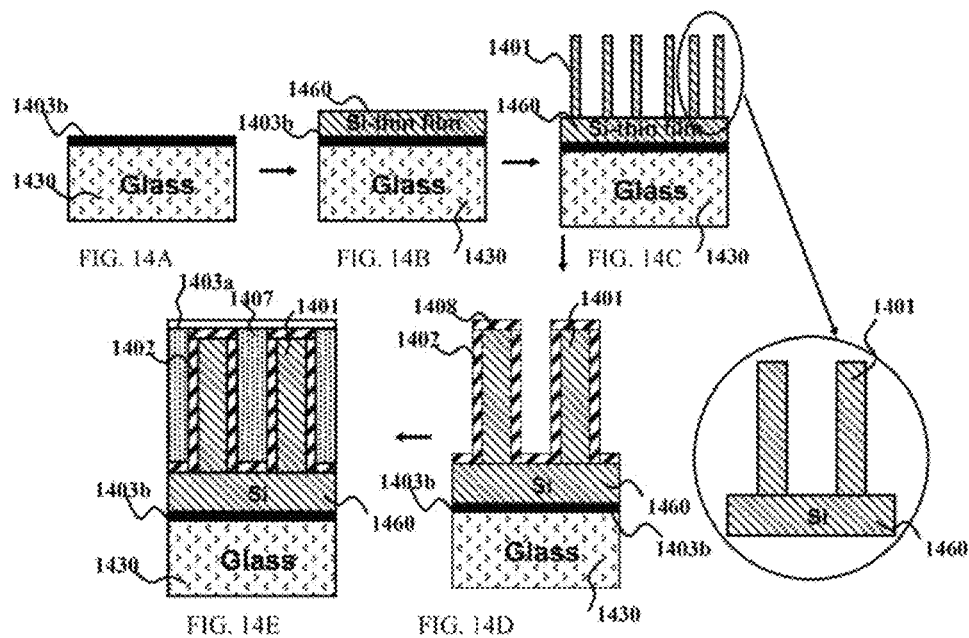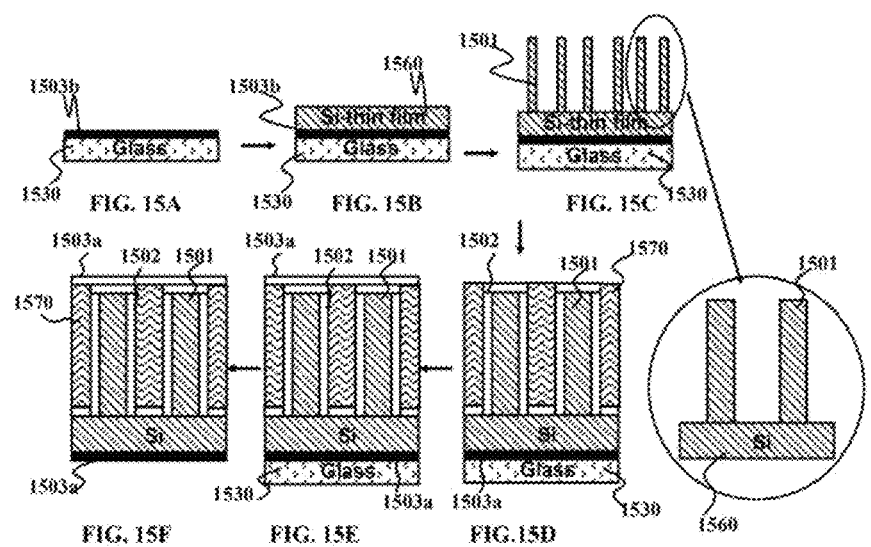

HIGH EFFICIENCY PHOTOVOLTAIC CELLS AND MANUFACTURING THEREOF

PARENT CASE TEXT

This is a divisional of application(s) Ser. No. 11/555,445 filed on Nov. 1, 2006.

CROSS REFERENCE TO RELATED APPLICATIONS

This application claims the benefit of U.S. Provisional Application No. 60/597,419 filed Nov. 29, 2005.

FIELD OF INVENTIONS

This patent specification relates to structures of photovoltaic cells (also solar cells). More specifically, it relates to photovoltaic cells comprising structures that increase the junction area in order to increase power generation capability per unit area and also amplifying the light incident to the cell. This also relates to photovoltaic cells containing nano or micro scaled-blocks. These photovoltaic cells can be used in commercial, residential, and also industrial applications for power generation.

BACKGROUND OF THE INVENTIONS

Photovoltaic cells where light is converted into electric power to be fed to external loads, which are electrically connected to the photovoltaic cells, have been prevailing in a wide range of applications such as consumer electronics, industrial electronics, and space exploration. In consumer electronics, photovoltaic cells that consist of materials such as amorphous silicon are used for a variety of inexpensive and low power applications. Typical conversion efficiency, i.e. the solar cell conversion efficiency, of amorphous silicon based photovoltaic cells is in the range of ~10% [Yamamoto K, Yoshimi M, Suzuki T, Tawada Y, Okamoto T, Nakajima A. *Thin film poly-Si solar cell on glass substrate fabricated at low temperature*. Presented at MRS Spring Meeting, San Francisco, April 1998.]. Although the fabrication processes of amorphous silicon based photovoltaic cells are rather simple and inexpensive, one notable downside of this type of cell is its vulnerability to defect-induced degradation that decreases its conversion efficiency.

In contrast, for more demanding applications such as residential and industrial solar power generation systems, either poly-crystalline or single-crystalline silicon is typically used because there are more stringent requirements of better reliability and higher efficiency than those in consumer electronics. Photovoltaic cells consisting of poly-crystalline and single-crystalline silicon generally offer conversion efficiencies in the range of ~20% and ~25% [Zhao J, Wang A, Green M, Ferrazza F. *Novel 19.8% efficient 'honeycomb' textured multicrystalline and 24.4% monocrystalline silicon solar cell. Applied Physics Letters* 1998; 73: 1991-1993.] respectively. As many concerns associated with a steep increase in the amount of the worldwide energy consumption are raised, further development in industrial solar power generation systems has been recognized as a main focus for an alternative energy source. However, due to the high cost ($3 to $5/Watt) of today's Si-based solar cell, it is not yet widely accepted as an alternative energy source solution.

Group II-VI compound semiconductors, for example CdTe and CdS, have been considered for the purpose of creating industrial solar power generation systems, manufactured at a lower cost and maintaining a moderate conversion efficiency. This approach resulted in a comparable conversion efficiency of ~17% [Wu X, Keane J C, Dhere R G, DeHart C, Duda A, Gessert T A, Asher S, Levi D H, Sheldon P. *16.5%-efficient CdS/CdTe polycrystalline thin-film solar cell. Proceedings of the 17th European Photovoltaic Solar Energy Conference*, Munich, 22-26 Oct. 2001; 995-1000.]. This conversion efficiency is comparable to those for the single crystalline silicon photovoltaic devises; however, the toxic nature of these materials is of great concern for environment.

Group I-III-VI compound semiconductors, such as $CuInGaSe_2$, have also been extensively investigated for industrial solar power generation systems. This material can potentially be synthesized at a much lower cost than its counterpart, single crystalline silicon. However, a conversion efficiency of ~19%, is comparable to that of single crystalline silicon based cells and can be obtained, thus far, only by combining with the group II-VI compound semiconductor cells [Contreras M A, Egaas B, Ramanathan K, Hiltner J, Swartzlander A, Hasoon F, Noufi R. *Progress toward 20% efficiency in Cu(In,Ga)Se polycrystalline thin-film solar cell. Progress in Photovoltaics: Research and Applications* 1999; 7: 311-316.], which again raises issues associated with the toxic nature of these materials.

Photovoltaic cells designed for several exclusive applications, where the main focus is high conversion efficiency, generally consist of group III-V semiconductors, including GaInP and GaAs. In general, synthesis processes of single crystalline group III-V are very costly because of substantial complications involved in epitaxial growth of group III-V single crystalline compound semiconductors. Typical conversion efficiencies of group III-V compound semiconductor based photovoltaic cells, as these types of photovoltaic cells are intended to be, can be as high as ~34% when combined with germanium substrates, another very expensive material [King R R, Fetzer C M, Colter P C, Edmondson K M, Law D C, Stavrides A P, Yoon H, Kinsey C S, Cotal H L, Ermer J H, Sherif R A, Karam N H. *Lattice-matched and metamorphic GaInP/GaInAs/Ge concentrator solar cells. Proceedings of the World Conference on Photovoltaic Energy Conversion (WCPEC-3)*, Osaka, May 2003; to be published.], usually more than 10 times as expensive as the conventional Si-solar cell.

All photovoltaic cells in the prior art described above, regardless of what materials the cell is made from, essentially fall into one specific type of structure, which usually limits its power generation capability. Usually a flat pn-junction structure is used in conventional solar cells (FIG. 1A). Shown in FIG. 1A is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generates electron-hole pairs after being absorbed by the p- and also n-type semiconductor layers 101 and 102. The incident light 104 generates electrons 105*e* and holes 105*h* in the region near the pn-junction 103 and also electrons 106*e* and holes 106*h* in the region far from the pn-junction 103. The photogenerated electrons 105*e* and 106*e* (and holes) (hereafter considering only electronics, i.e. minority carriers in p-type semiconductors, although the same explanation is applicable for holes, minority carriers in n-type semiconductors) diffusing toward the pn-junction 103 and entering the pn-junction 103 contribute to photovoltaic effect. The two key factors that substantially impact the conversion efficiency of this type of photovoltaic cell are photo carrier generation efficiency (PCGE) and photo carrier collection efficiency (PCCE).

The PCGE is the percentage of photons entering a cell which contribute to the generation of photo carriers, which needs to be, ideally, 100%. On the other hand, the PCCE is the percentage of photogenerated electrons 105e and 106e that reach the pn-junction 103 and contribute to the generation of photocurrent. For a monochromatic light, a PCGE of ~100% can be achieved by simply making the p-type layer 101 thicker; however, electrons 106e generated at the region far away from the pn-junction 103 cannot be collected efficiently due to many adverse recombination processes that prevent photogenerated carriers from diffusing into the pn-junction 103. Thus, the basic structure of current photovoltaic cells has its own limitation on increasing the conversion efficiency.

FIG. 1B shows typical monochromatic light intensity behavior 108 inside the semiconductor. As illustrated in FIG. 1B, the light intensity behavior 108 inside the bulk semiconductor is exponential. The light intensity p at certain depth x can be expressed as $p(x)=P_o \exp(-\alpha x)$, where $P_o$ is the peak intensity at the surface and $\alpha$ is the absorption co-efficient of the semiconductor in which light is entering. Carriers (not shown here) generated due to light flux 112 absorbed by the pn-junction 103 is only drifted by the junction field and can be collected efficiently, whereas, carriers 106e and 106h generated due to absorption of light-flux 110 by semiconductor region 101 are diffused in all directions. Only those carriers 105e and 105h which are generated closer (a distance equal to or less than the diffusion-length of the semiconductor) to the pn-junction 103 can be collected. Those carriers 106e and 106h which are generated far away (a distance longer than the diffusion-length of the semiconductor) from the pn-junction 103 are recombined and lost. The light flux 112 is usually lost either by leaving out or being absorbed by the substrate.

Both PCGE and PCCE are largely dependent on the material and structure of the photovoltaic cells. Today's photovoltaic cells are structured in such a way that (a) wide ranges of the solar spectrum cannot be absorbed due to material limitations, and (b) PCCE is low due to its inherent structure. For example, the typical conversion efficiency of today's crystal-Si based solar cell is ~18%. Wavelengths of the solar spectrum spread from <0.1 µm to 3.5 µm, but Si can only absorb ~0.4 µm to 0.9 µm of light. ~50% of light belonging to the solar spectrum cannot be absorbed by Si, due to its inherent material properties. The remaining 32% is lost due to (i) recombination of photogenerated carriers and (ii) loss of light, which is represented by 112 in FIG. 1B; these two factors are structure dependent. If we could reduce these two factors, ~50% conversion efficiency could be achieved, even in a Si-based solar cell. If we could capture different wavelengths of light belonging to the solar spectrum by utilizing different alloyed materials, we could increase the conversion efficiency ideally to 100%. Furthermore, if the solar cell detection capability could be extended to the infrared-spectrum, then the solar cell could produce electrical energy not only during the day (while sun is present), but also at night (hereafter defined by when the sun is not out). Additionally, today's solar cell material is not highly radiation-tolerant. Specifically, in space applications, photovoltaic cells should be highly radiation tolerant and have structure and material systems which can generate high-power per unit area.

For both commercial and space applications, therefore, it would be desirable to have photovoltaic cell structures where both the PCGE and the PCCE can be increased simultaneously by having a photo absorption region which is thick enough to capture all the photons entering the cell and a pn-junction which is located as close to the photo absorption region as possible. It would be further desirable to have, while maintaining ideal PCGE and PCCE, materials which have photo responses at different spectrums in order to efficiently cover a wide spectrum of light that enters a photovoltaic cell. It would be further desirable to have a large junction area within a given volume of a photovoltaic cell so that generated electric power that is proportional to the junction area can be maximized. It would be further desirable to have solar cells which could generate electric power in both day and night.

In today's solar cell, high-cost is also a main factor, in addition to the issue of low conversion efficiency. It is found that more than 93% of solar cells are silicon (Si) based, meaning a silicon (Si) wafer is the base material, and the rest are thin-film based solar cells. In manufacturing Si-based solar cells, more than 85% of the cost comes from the Si wafer cost, the remaining comes from other processing costs. It is highly desirable to reduce the wafer cost and at the same time increase the conversion efficiency.

BRIEF SUMMARY OF THE INVENTION

Accordingly, it is an object of the invention to provide structures of photovoltaic cells, which have high power generation capability per unit area, with respect to the conventional counterparts, mentioned as the prior art.

Accordingly, it is an object of this invention to reduce the recombination of carriers and increase the absorption of light, which effectively increases the photogenerated carriers.

It is an object of this invention to provide solar cell structures based on pyramid, trapezoidal, and cylindrical shaped structures, formed on the supporting substrate or formed on the electronic materials which are formed on the base substrate. The pn- or Schottky junctions are formed with nano-blocks, which generate built-in potential by which photogenerated electrons and holes are swept away, leading to photovoltaic effect.

It is an object of this invention to provide solar cell structures based on nano blocks, such as rods or wires formed on the supporting substrate or formed on the electronic materials which are formed on the base substrate. The pn- or Schottky junctions are formed with nano-blocks, which generate built-in potential by which photogenerated electrons and holes are swept away, leading to photovoltaic effect.

According to this invention, the supporting substrate can be Si, CdTe, Cu, GaAs, InP, GaN, glass, Ge, C, ZnO, BN, $Al_2O_3$, AlN, Si:Ge, CuInSe, II-VI and III-V.

It is an object of this invention to have electronic materials on which nano-blocks (rods, wires, or tubes) can be formed and that electronic materials can be formed on a base substrate such as Si, Ge or glass, to decrease the cost.

It is an object of this invention to provide structures of photovoltaic cells which can capture most of the wavelengths belonging to the solar spectrum and can provide >80% conversion efficiency.

It is an object of this invention to provide structures of the photovoltaic cells which can generate electric power when the sun is and is not out.

This invention offers to ideally achieve >50% conversion efficiency utilizing Si-materials and >80% conversion efficiency for other materials. The main advantage of these inventions are that today's highly matured semiconductor process technologies can allow fabrication of the proposed photovoltaic cell which has much larger power generation capabilities as compared to that of conventional photovoltaic cells.

According to this invention, it is also an object to use the nano or micrometer scaled blocks to increase the surface area and also to increase the amplifying or concentrating the light incident onto the surface. The side of the nano or micrometer(s) scaled blocks could be any shape such as vertical or inclined at specific angle with respect to substrate surface.

Other objects, features, and advantages of the present invention will be apparent from the accompanying drawings and from the following detailed description.

BRIEF DESCRIPTION OF THE DRAWINGS

The invention will be explained in more detail in conjunction with the appended drawings wherein:

FIGS. 1A and 1B show the cross-sectional view of a conventional photovoltaic cell structure. These are the explanatory diagrams representing today's photovoltaic cell and the light intensity behavior inside semiconductor materials. FIG. 1A specifically shows a cross-sectional view of a flat pn-junction photovoltaic cell, while FIG. 1B shows typical monochromatic light intensity behavior inside the cell of FIG. 1A.

FIGS. 2A and 2B show the pyramid structures used to achieve the benefit of a larger junction area used in the simulation, where FIG. 2A shows a top-down view of an array of pyramids, and FIG. 2B shows a zoomed-in view of a single pyramid from the side. FIG. 2C shows the ratio of the surface area T to the base area A as a function of height h with pyramid base side m as the parameter.

FIGS. 3A and 3B show the trapezoidal pyramid structures used to achieve the benefit of a larger junction area used in the simulation, and FIGS. 3C, 3D, and 3E shows the ratio of the surface area T to the base area A as a function of height h.

FIGS. 4A and 4B show the cylinder structures used to achieve the benefit of a larger junction area used in the simulation, and FIG. 4C shows the ratio of the surface area T to the base area A as a function of height h with cylinder base diameter m as the parameter.

FIGS. 9A, 9B, 9C, 9D, and 9E show the cross-sectional views of a photovoltaic cell structure consisting of the cylindrical shaped structures, made of either substrate material or the nano-blocks, vertically arranged in the fourth embodiment, in accordance with the present invention.

FIGS. 10A, 10B, 10C, 10D, 10E, and 10F show the fabrication process flow of photovoltaic cells comprising of the pyramid-shaped structure in the fifth embodiment in accordance with the present invention.

FIGS. 11A, 11B, 11C, 11D, and 11E, show the fabrication process flow of photovoltaic cells comprising of the trapezoidal-shaped structure in the sixth embodiment in accordance with the present invention.

FIGS. 12A, 12B, 12C, 12D, 12E, and 12F show the fabrication process flow of photovoltaic cells comprising of the cylindrical-shaped structure in the seventh embodiment in accordance with the present invention.

FIGS. 13A, 13B, 13C, 13D, and 13E show the fabrication process flow of photovoltaic cells comprising of numerous cylindrical shaped nano-rods vertically arranged in the eighth embodiment in accordance with the present invention.

FIGS. 14A, 14B, 14C, 14D, and 14E show the fabrication process flow of photovoltaic cells comprising of numerous cylindrical shaped nano-rods vertically arranged and formed on the glass substrate as the base material in the ninth embodiment in accordance with the present invention.

FIGS. 15A, 15B, 15C, 15D, 15E and 15F show the fabrication process flow of photovoltaic cells comprising of numerous cylindrical shaped nano-rods vertically arranged and embedded inside the flexible polymer formed on the glass substrate as the base material in the tenth embodiment in accordance with the present invention.

DETAILED DESCRIPTION

Figure 3D:
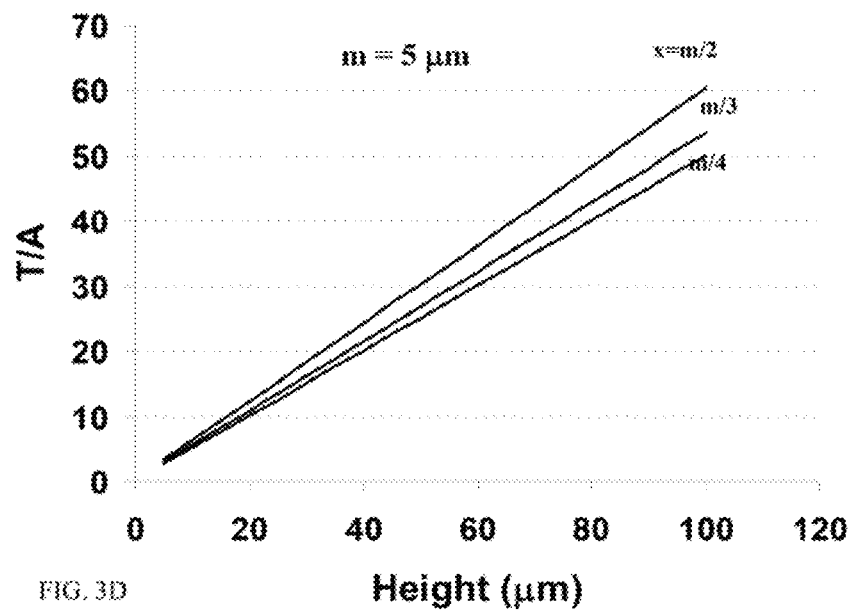

According to the present invention it is our object to provide several photovoltaic cell structures that increase the surface area, which increases the junction area, which increases conversion efficiency. Before giving the detail explanation of the photovoltaic cell structures and their manufacturing, several simulation results are first given to show the benefits of increasing the surface area.

FIGS. 2A and 2B are schematics representing the pyramid shaped structure 204 uniformly arranged on the substrate 200. FIG. 2C shows the simulation results as function of the pyramid height h, with pyramid base m as the parameter. In FIG. 2A, n number of the pyramids 204 are arranged on the axa sized substrate 200. T/A is the ratio of the surface area of the total pyramids T to the total area of axa A. It is assumed that we could make the n number of pyramids 202 on the axa-area surface. Increase of the ratio indicates the increasing increment of the surface area T as compared to the conventional solar cell, which is usually flat. Assume that pyramid 204, as shown in FIG. 2B, has four sides which are equal in area. As depicted in FIG. 2C, reducing the pyramid base offers more surface for a fixed height.

Figure 3E:
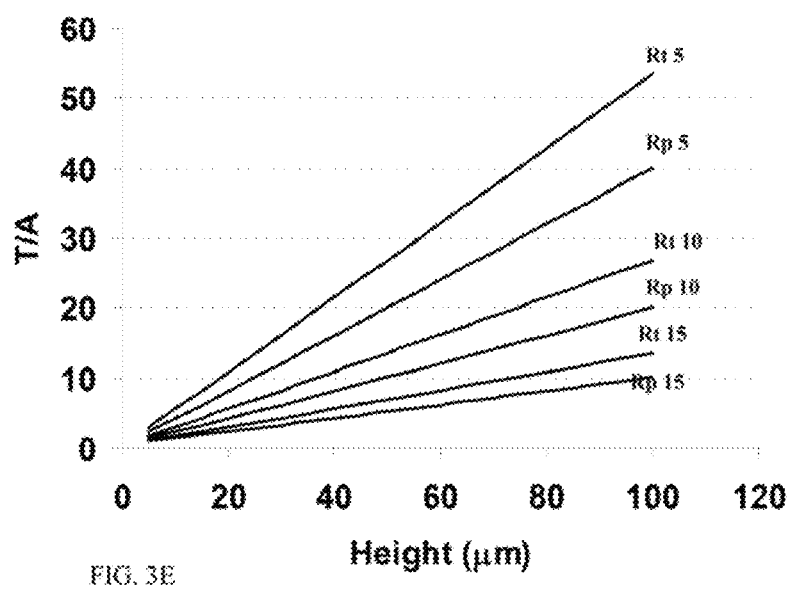

FIGS. 3A and 3B are the schematics representing the trapezoidal shaped structure uniformly arranged on the substrate 300. FIGS. 3C, 3D, and 3E show the simulation results as function of the trapezoidal vertical height h with the bottom base m and the top base x as the parameters, wherein similar numerals represent similar parts as described in the discussion of FIG. 2, so that the similar explanation is omitted. Reducing the bottom base increases significantly the surface area for the fixed top base because more structures can fit on the same area. Also that, the reducing the top base will reduce the surface area as compared with the pyramid shaped structure, where top and bottom bases are equal.

FIGS. 4A and 4B are the schematics representing the cylindrical shaped structure uniformly arranged on the substrate 400. FIG. 4C is the simulation results as function of the cylinder height h with cylinder base diameter m as the parameter. In FIG. 4A, n number of cylinders are arranged in axa sized substrate 400. T/A is the ratio of the surface area T of the total cylinders arranged vertically, to the total area A of axa. It is assumed that we could make the n number of cylinders 402 on the axa-area surface. Increase of the ratio indicates the increment of the surface area T as compared to the conventional solar cell, which is usually flat. As depicted in FIG. 4C, reducing the pyramid base offers more surface area for the fixed height.

Figure 5A:
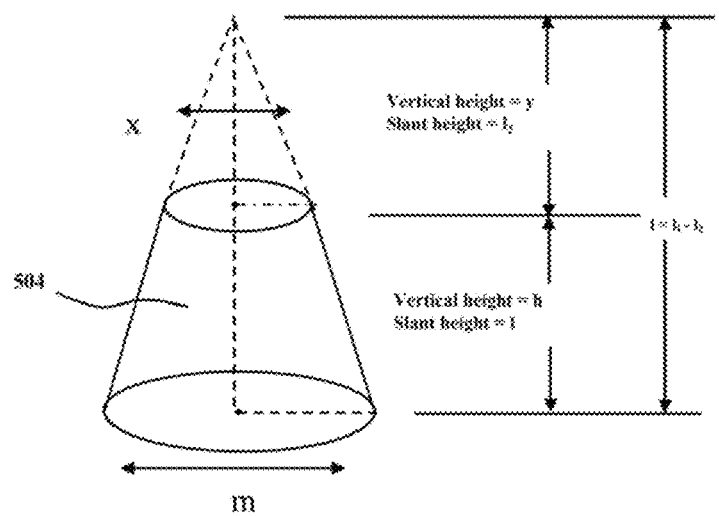
FIG. 5A shows the cone structures used to achieve the benefit of a larger junction area used in the simulation.
Figure 5B:
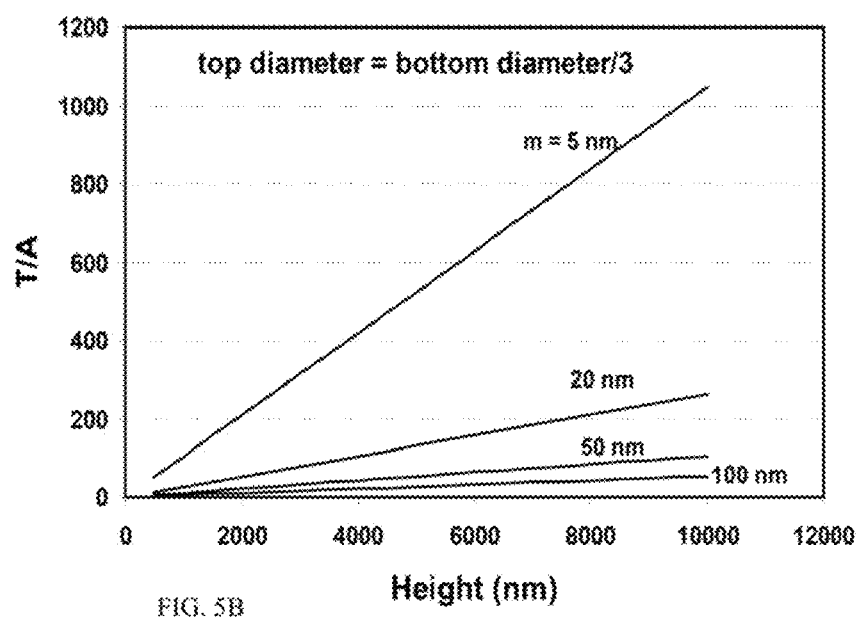
FIGS. 5B and 5C show the ratio of the surface area T to the base area A as a function of height h with cone base diameter m as the parameter.
Figure 5C:
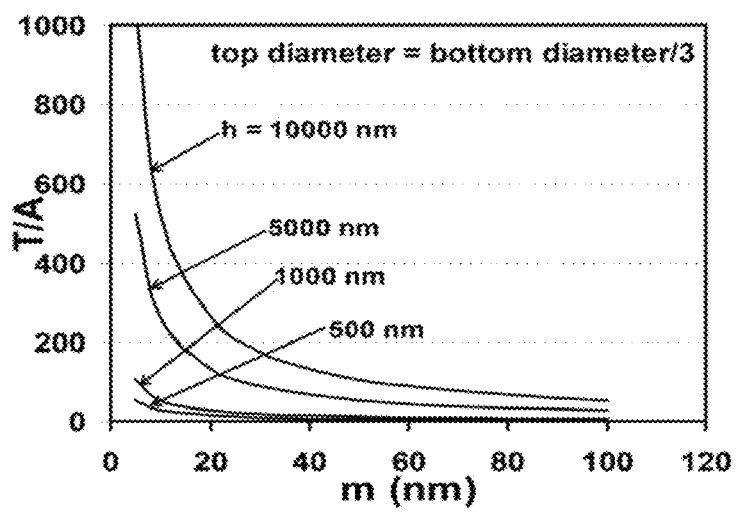

FIG. 5A is the schematic representing the opened-cone shaped structure uniformly arranged on the substrate, and FIGS. 5B and 5C are the simulation results as function of the cone vertical height h, where the open base m is the parameter, wherein similar numerals represent similar parts as described in the discussion of FIG. 4, so that the similar explanation is omitted. Reducing the bottom base increase significantly the surface area for the fixed top base because more structures can fit on the same area. Also that, the reducing the top base will reduce the surface area as compared with the cone shaped structure, where top base is zero.

Figures 6A, 6B:
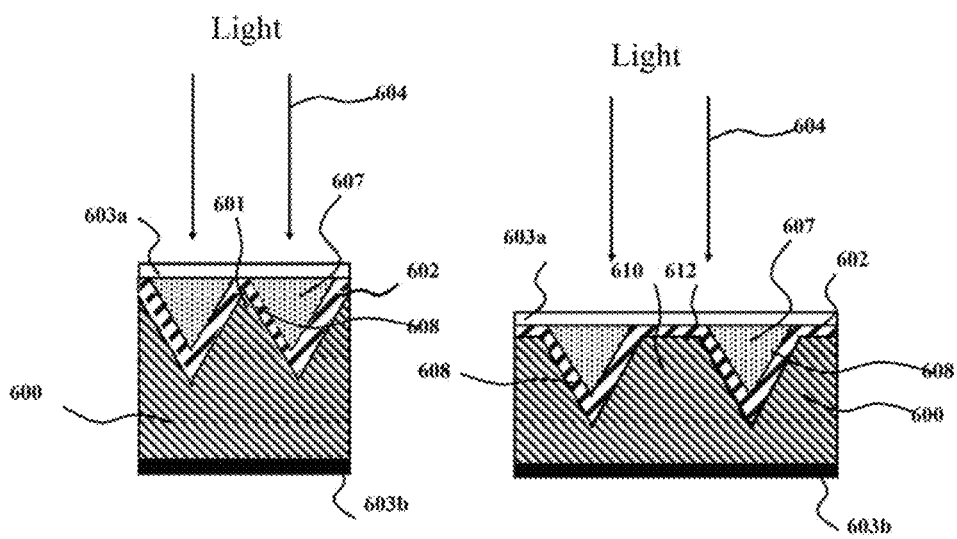
FIGS. 6A and 6B show the cross-sectional views of a photovoltaic cell structure consisting of the pyramid and trapezoidal shapes in the first embodiment, in accordance with the present invention.

According to a preferred embodiment illustrated in FIG. 6A, a photovoltaic cell comprising a plurality of micrometer(s)-scaled pyramids 601 are formed on the supporting substrate 600 (after having groove). The micrometer(s)-scaled pyramids 601 can have metallic electrical conduction, p-type or n-type semiconductor electrical conduction. The micrometer(s)-scaled pyramids 601 are surrounded by an electronic material 602 having metallic electrical conduction, p-type or n-type semiconductor electrical conduction. The electronic material 602 can be a separate material or electronic materials of p or n type formed inside 601 and 600. The electronic material 602 and the supporting substrate 600 are further electrically connected to electrodes 603a and 603b, respectively. The electrodes 603a and 603b are intended to serve as common electrodes that connect all pyramids 601. The electrode 603a is provided for the electronic material 602 or junction 608. The electrode 603a can be transparent (not shown here) and can be formed on the electronic material 602 or junction 608. The interface between the micrometer scaled pyramids 601 and the electronic material 602 (or junction 608) form pn- or Schottky junctions where built-in potential for both electrons and holes is generated.

According to this invention, alternatively the micrometer(s)-scaled pyramids 601 can be formed on a separate substrate (not shown here), and the electrode 603b can be formed on the substrate to have a common contact for each micrometer(s)-scaled pyramid 601, necessary for creating a junction. In way of an example not way of limitation, the nanometer(s)-scaled pyramids 601 can be made of n-type semiconductor and the electric material 602 that is on or surrounds the micrometer(s)-scaled pyramids 601 can be made of p-type semiconductor. Incident light 604 enters the photovoltaic cell through either the electrode 603a or on the material 602 or junction 608. (In FIG. 6A, the incident light enters the photovoltaic cell through the electrode 603a). The incident light 604 travels through pyramids 601, electronic material 602 (n or p-type) or junction 608, and the substrate 600. As the incident light 604 travels through the micro-scaled pyramids 601 and electronic material 602, numerous electrons (not shown here) are generated in the region near the electrode 603a. Portions of light 604 which pass through the valley portion of the pyramids 601 where another electronic material 607 is used for passivation or to make the junction in between micro-scaled pyramids 601, are traveling through the electronic material 602 and the supporting substrate 600, which generates electrons (not shown here). Some that are generated closer to electronic material 602 are collected and some that are generated in the region far from the electronic material 602 are recombined and lost. It should be pointed out that electrons are apparently generated all over the region along the thickness of the electric material 602 or junction 608. In addition, as the incident light 604 travels through the micrometer(s)-scaled pyramids 601, numerous holes (not shown here) are generated in the pyramids 601 and in the substrate 600. It also should be pointed out that holes are apparently generated all over the region along the thickness of the micrometer(s)-scaled pyramids 601 and the substrate 600. Photogenerated electrons generated in the electronic material 602, pyramids 601, and substrate 600 diffuse toward pn-Junctions 608, created at the interface between the micrometer(s)-scaled pyramids 601 and the electronic material 602, and also at the interface between the electronic material 602 and substrate 600. At the pn-junctions 608, the electrons and the holes are swept away by built-in potential, thus photovoltaic effects set in.

Unlike a conventional solar cell, the solar cell shown in FIG. 6A has pn-junctions on all sides of the pyramids 601. The pn-junctions 608 formed in the side of the pyramids 601 have height h and a surface area dependent on the height h of the pyramids 601. The light 604 travels at an angle to the direction of the pn-junction 608 formed across the side of the pyramids 601. Most of the light flux incident on the pn-junction 608 is absorbed and most of the photogenerated carriers can be collected. Most of the light flux incident onto the sides can also be absorbed, and the carriers generated by the light 604 can be collected without recombination (ideally). It is apparent that utilizing the solar cell shown in FIG. 6A can (i) reduce the recombination and (ii) absorb all photo-flux, thereby increasing the conversion efficiency.

According to a preferred embodiment illustrated in FIG. 6B, a photovoltaic cell comprising a plurality of micrometer(s)-scaled trapezoids 610 are formed on the supporting substrate 600 (after having groove). The only difference in FIG. 6B, as compared to FIG. 6A, is that the top 612 is opened and receives a portion of the light 604. Again, because the surface area of the junction for receiving the light 604 is increased, there is a reduction of the photogenerated carrier recombination and absorption of all photo-flux incident on the surface, thereby increasing the conversion efficiency.

Apparent advantages of this invention over conventional photovoltaic cells are directly associated with the fact that, unlike conventional photovoltaic cells, large portions of the pn-junctions are used for collecting photogenerated carriers created in the electronic material 602. This is true regardless of where the carriers were generated because the distance they have to diffuse to reach the pn-junctions, created on the surface of the pyramids (601) or trapezoids (610), is within the range of the diffusion length of the carriers and independent of the location where they were generated. Furthermore, the distance the photogenerated carriers created in the pyramids (601) or trapezoids (610) have to diffuse to reach pn-junctions is within the range of the diffusion length of the carriers, regardless of where they were generated. By properly selecting height h and the base m of the pyramids (601) or trapezoids (610), all carriers generated inside the semiconductor can be collected. According to this invention, the recombination can be zero (ideally), all photon flux can be absorbed (ideally), and the conversion efficiency can be ~100%, and >50% using Si. On the other hand, as explained in the description of the prior art shown in FIG. 1, in conventional photovoltaic cells, pn-junctions are perpendicular to the direction to which incident light travels and the photogenerated carriers generated in region far away from pn-junctions need to diffuse much longer distances (diffusion-length) than that for the photogenerated carriers generated near the pn-junctions. Thus, they have a greater chance to recombine without contributing to photovoltaic effects. Therefore in this invention, PCCE is expected to be much higher than that of conventional photovoltaic cells. In addition, it is evident that the total effective area that contributes to photovoltaic effect in this invention can be increased significantly by a few orders (>3000) (using a 300 mm diameter substrate, 500 µm height rods having 50 nm diameter and 50 nm pitch).

According to this invention, in way of an example not way of limitation, the supporting substrate 600 can be n-type or p-type Si of <100> orientation, on which the pyramids (601) or trapezoids (610) can be formed by using the process of patterning, using the standard photolithographic technique, and wet etching, using KOH solution. The dopants of opposite type of the substrate can be diffused into the surface of the pyramids (601) or trapezoids (610) to form the electronic material 602 of Si p-type. Conformal deposition of the dielectric material (not shown) can be done for planarization, and in this case silicon oxide or polymer can be used. Without dopant diffusion, the electronic material 602 can be separate Si-epitaxial growth to make the junction with the Si-substrate.

According to this invention, in a way of an example not way of limitation, the supporting substrate 600 can be Ge, GaAs, InP, GaN, ZnO, CdTe, or any suitable semiconductor substrate in which pyramids 601 or trapezoids 610 can be formed. Alternatively, the supporting substrate 600 can be a polymer material or metal (e.g. copper) on which the semiconductor can be deposited or formed either by deposition or electrolytic way, and the pyramid 601 and trapezoid 610 are formed on the substrate before the semiconductor is formed on it.

Figure 7:
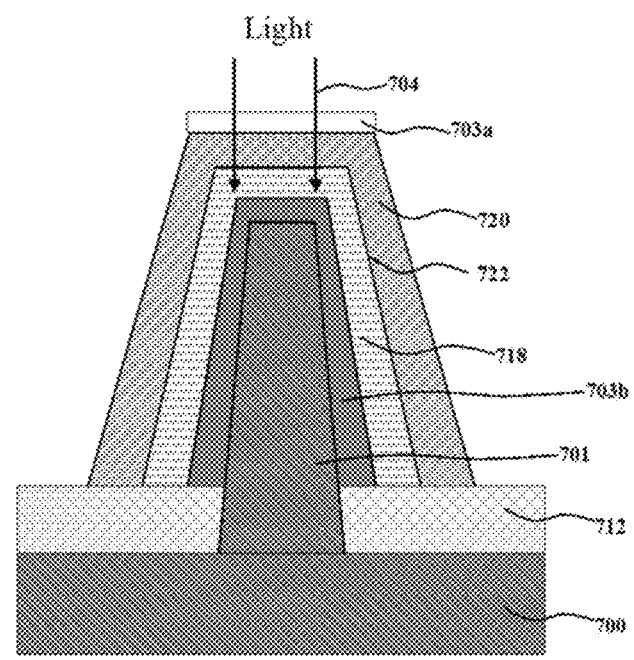
FIG. 7 shows the cross-sectional view of a photovoltaic cell structure consisting of the trapezoidal shapes in the second embodiment, in accordance with the present invention.

In an alternative preferred embodiment shown in FIG. 7, a photovoltaic cell comprises a plurality of micro or nanometer(s)-scaled trapezoids or cylinders 701, which are electrically connected to a substrate 700. The cylinders, trapezoids, or pyramids 701 can have metallic electrical conduction, p-type or n-type semiconductor electrical conduction. The dielectric layer 712 on the substrate 700 isolates the cylindrical or trapezoidal shaped rods. The micro or nanometer(s)-scaled trapezoids, pyramids, or cylinders 701 are surrounded by electronic materials 718 and 720 having metallic electrical conduction, top and bottom contacts 703a and 703b. The electronic materials 718 and 720 form p-type or n-type semiconductor electrical junction 722. The electronic materials 718 and 720 can be separate materials or electronic materials of p or n type formed inside or on 701 and 700. The electronic materials 720 and 718 are further electrically connected to electrodes 703a and 703b, respectively. The electrodes 703a and 703b are intended to serve as common electrodes that connect all cylindrical pyramid, or trapezoidal shaped electrical junctions 722. The electrode 703a is on the electronic material 720. The interface between the nanometer(s)-scale rods 701 and the electronic material 720 form pn- or Schottky junctions 722, thus there are pn- or Schottky junctions on both sides, inside and outside, of the micro or nanometer(s)-scale trapezoidal, pyramid or cylindrical rods 701.

According to this invention, alternatively the nanometer(s)-scale rods 701 can be formed on the substrate (not shown here), and the electrode 703a can be made on the substrate to have a common contact for each nanometer(s)-scale rod 701, necessary for creating a junction.

In way of an example not way of limitation, the micro or nanometer(s)-scale trapezoidal, pyramid, or cylindrical rods 701 can be made of metal and the electronic materials 718 and 720 that surround the micro or nanometer(s)-scale trapezoidal, pyramid, or cylindrical rods 701 can be made of p-type semiconductor; thus, the interface of 718/720 forms pn-junctions 722 in the micro or nanometer(s)-scale trapezoidal, pyramid, or cylindrical rods 701. Incident light 704 enters the photovoltaic cell through the electronic material 720 (front-side of the cell). As the incident light 704 travels through the electronic material 720, numerous electrons (not shown here) are generated. It should be pointed out that electrons (of electron-hole pairs) are apparently generated all over the region along the thickness of the nanometer(s)-scale rods 701 and also the gaps in between rods 701. Photogenerated electrons in the electronic materials 718 and 720 made of p and n-type-type semiconductors then diffuse toward pn-junctions 722 in the interface of 718/720. At the pn-junctions, the diffused electrons are swept away by built-in potential, thus photovoltaic effects set in.

Common advantages are previously described for the photovoltaic cell in the discussion of FIG. 6. The only difference is the forming of the nano-scaled rods, which are formed without forming the grooves.

According to this invention, in way of an example not way of limitation, the supporting substrate 700 can be Si, on which trapezoids or slanted cylinders can be made by conventional photolithography followed by wet etching, using standard etchant (e.g. KOH solution). In order to isolate the trapezoids, a dielectric layer of silicon oxide can be used. Different types of thin-films, of p-type and n-type, can be deposited on the slanted cylinders 701 after uniform metallization, to form the electrode 703b. The thin films could be any suitable thin film which could form the junction. For example, they are the combination of CdTe/CdS, Zn(Cd)Te/Zns, ZnO based materials, Si based alloyed material (e.g. Si:Ge or a-Si), GaAs or InP based alloyed materials, etc. Conformal deposition of the electronic material can be done based on the slant angle and planarization (not shown here).

According to this invention, in way of an example not way of limitation, the supporting substrate 700 can be Ge, GaAs, GaN, InP, GaN, CdTe, or ZnO.

Figure 8:
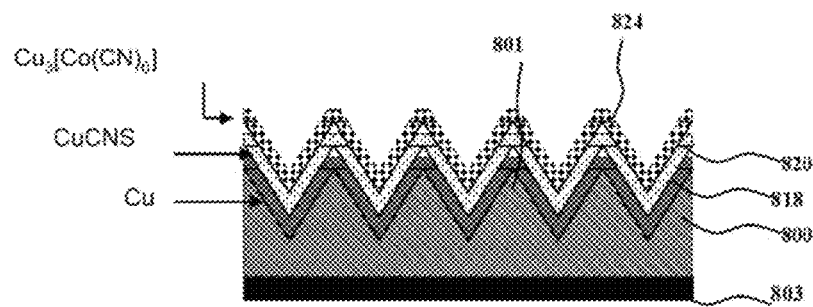
FIG. 8 shows the cross-sectional view of a photovoltaic cell structure consisting of the pyramid-shaped structures in the third embodiment, in accordance with the present invention.

In an alternative preferred embodiment shown in FIG. 8, a photovoltaic cell comprises a plurality of micro-meter(s) scaled pyramids or trapezoids 801 (pyramids shown in FIG. 8), which are electrically connected to a substrate 800. The micro-meter(s) scaled pyramids or trapezoids 801 are surrounded by electronic materials 818 and 820 having metallic electrical conduction. The electronic materials 818, 820, and 824 and the supporting substrate 800 are further electrically connected to electrode 803. The micro-meter(s) scaled pyramids or trapezoids have a top surface consisting of a electronic material 824, which can have metallic electrical conduction, with suitable electrolyte solution (not shown). To collect the charge from the electrolyte, another electrode needs to be placed in the electrolyte. The substrate 800 can be a metal such as copper and can be formed into a pyramid or any cylindrical structure. Alternatively, the metal can be formed onto the substrate 800, which has a pyramid surface.

By using an electrolyte based solution, CNS solution, CuCNS film can be formed onto the substrate 800 as $Cu+CNS^- \rightarrow CuCNS$. Again, a copper hexa cyanide layer can also be formed onto the CuCNS by electrolyte processes as $CuCNS+K_3[Co(CN)_6] \rightarrow Cu_3[Co(CN)_6]+KCNS$. A dye molecule, such as rhodamine, can be put into the copper hexacyanide layer formed on CuCNS. By using the appropriate electrolyte solution, the structure shown in FIG. 8 can generate charge under illumination. As the surface area is increased the conversion efficiency can be increased significantly. It should be noted that the dye sensitization is successful in some semiconducting materials which are less important in efficient solar cell manufacturing such as $TiO_2$, $SnO_2$, $SnS_2$, CuCNS, ZnO, CuI and $WO_3$. These semiconductors provide advantages because they can be fabricated in spray pyrolysis, sol-gel or dip coating techniques. They are relatively stable at semiconductor/electrolyte Junctions because many of them are oxides or stable forms of metal halides.

In an alternative preferred embodiment shown in FIGS. 9A, 9B, 9C, 9D, and 9E, a photovoltaic cell comprises a plurality of micrometer(s) or nanometer(s)-scaled rods (or cylinders) 901, which are electrically connected to a substrate 900. The micrometer(s) or nanometer(s)-scaled rods (or cylinders) 901 can have metallic electrical conduction, p-type or n-type semiconductor electrical conduction. The micrometer(s) or nanometer(s)-scaled rods (or cylinders) 901 are surrounded by an electronic material 902 having metallic electrical conduction, p-type or n-type semiconductor electrical conduction. The electronic material 902 can be a separate material or electronic materials of p or n type formed on 901 and 902. The electronic material 902 and the supporting substrate 900 are further electrically connected to electrodes 903a on the top side and another on the substrate side (not shown here). The interface between the nanometer(s)-scale rods 901 and the electronic materials 902 form pn-junctions 908, thus creating built-in-potential for collecting photo-generated carriers. The main difference between the solar cell shown in FIG. 9A and others of FIGS. 9B, 9C, 9D, and 9E is that the micrometer(s) cylinder is formed on the supporting substrate 900. For example, if Si of (111) is used as the substrate 900, the vertically arranged cylinders 901 can easily be formed using standard wet etching processes. Passivation material or polymer 945 can be used for plannarization and also to reduce the surface recombination.

According to this invention, as shown in FIGS. 9B and 9C, the nanometer(s)-scale rods 901 are formed on the material or directly onto the Si-substrate 900. In all cases, either thinner Si-substrates 900 can be used or the portion of the substrate 900 can have a smart-cut to reuse it again. The main difference between FIGS. 9B and 9C is that, the glass 930 is bonded directly to the remaining substrate (or thinner Si-substrate) by anodic bonding process in the case of FIG. 9B. In FIG. 9C, the glass 930 is bonded after forming the Silicon Oxide 940 on to the Si-Substrate. The differences in FIGS. 9D and 9E are that the initial substrate is a glass 930 type substrate (not shown in case for FIG. 9E) on which metal and the poly or a-Si 950 is deposited before forming the nanometer(s) rods 901. In the case of FIG. 9E, the glass substrate is taken out and the rods are embedded with the conductive polymer electronic material 945 to make the solar cell flexible. The details of these fabrication processes are explained later.

In way of an example not way of limitation, the electronic material 902 that surrounds the nanometer(s)-scale rods 901 can be made of p-type semiconductor, thus the interface of 902/901 forms pn-junctions 908. Incident light 904 enters into the photovoltaic cell through the electronic materials 901, 902, 900 (for FIGS. 9A, 9B, and 9C), and 950 (for FIGS. 9D and 9E). As the incident light 904 travels through the electronic materials 901, 902, 900, and 950, numerous electrons (not shown here) are generated in said electronic materials. It should be pointed out that electrons (of electron-hole pairs) are apparently generated all over the region along the thickness of the electronic materials 901, 902, 900, and 950. Photogenerated electrons in the electronic materials 901, 902, 900, and 950, then diffuse toward pn-junctions in the interface of 902/901 and 902/900 for FIGS. 9A, 9B, and 9C, and 902/901 and 902/950 for FIGS. 9D and 9E. At the pn-junctions, the diffused electrons are swept away by built-in potential, thus photovoltaic effects set in.

According to this invention, in way of an example not way of limitation, the supporting substrate 900 can be n-type Si, n-type InP, or InP-based alloy rods 901, which are formed directly onto the Si-substrate or onto lattice matched InP or InP based alloy formed on the Si-substrate. The p-type InGaAs layer(s), having broad spectral absorption ranging from as low as <0.3 µm to as high as 2.5 µm, is formed as the electronic material 902 of p-type. The metal contacts (not shown here) can be formed on InGaAs and substrate 900. Conformal deposition of the dielectric material (not shown) can be done for planarization, and in this case silicon oxide or polymer can be used. Using single or multiple layers of the InGaAs helps absorb more wavelengths of light from <0.3 µm to 2.5 µm, which belongs to the solar spectrum.

According to this invention, in way of an example not way of limitation, the supporting substrate 900 can be Ge, GaAs, GaN, CdTe, ZnO, Cu, $Al_2O_3$, AlN, etc.

According to this invention, in way of an example not way of limitation, the supporting substrate 900 can be n-type Si, on which lattice matched InP or InP based alloy is formed. Next, n-type InP, or InP-based alloy rods 901 are formed. The p-type InGaAs layer(s), having broad spectral absorption ranging from as low as <0.3 µm to as high as 2.5 µm, and an InSb based electronic material (not shown here) is formed as electronic materials of p-type. The metal contacts (not shown here) can be formed on InGaAs and substrate 900. Conformal deposition of the dielectric material (not shown) can be done for planarization, and in this case silicon oxide or polymer can be used. Using single or multiple layers of the InGaAs and other antimony based electronic materials helps to absorb more wavelengths of light from <0.3 µm to 3.5 µm, which belongs to the solar spectrum. Apparently, in addition to the common advantages over the prior art, already discussed in FIGS. 6-9, the additional advantage of the cell with multiple Junctions formed on the electronic material as compared to the single junction of the photovoltaic cells described in FIGS. 6-9, is to have the capability of covering the wide range of spectrums contained in incident light and converting a wide range of the spectrum to photogenerated carriers. Dozens of different layers could be stacked in order to catch photons at all energies, to absorb a wide band of the solar spectrum, from lower wavelengths (as low as X-ray) to longer wavelength (e.g. long infrared). The addition of multiple junctions of different materials which could absorb a wide range of the solar spectrum, plus the increase of the junction area by using the rods, will help increase the conversion efficiency close to 100% (ideally). According to this invention, dozens of materials, which could absorb a wide range of the solar spectrum may or may not require the lattice mismatch with the rod, wires, or tubes. Lattice matched material could further increase the power generation due to reduction of the recombination.

According to this invention, in way of an example not way of limitation, the supporting substrate 900 can be Ge, GaAs, GaN, CdTe, ZnO, Cu, $Al_2O_3$, AlN, etc.

FIGS. 10A, 10B, 10C, 10D, 10E, and 10F are the schematics showing the fabrication process of the photovoltaic cell using pyramid structures, according to this invention, wherein similar numerals in FIG. 10 represents the same parts in FIG. 6A, so similar explanations are omitted. According to this invention, supporting substrate 1000 can be crystal-Si, Ge, GaAs, or InP. Standard silicon oxide 1012 is formed around the substrate and it is used as the mask. After standard photolithography and wet-etching, grooves (pyramids) 1001 are formed onto the front surface of the substrate 1000. A certain crystal orientated substrate is to be used to achieve the pyramid/grooves structure. For example, in Si substrate case, <100> orientation Si is to be used for achieving the grooves.

After forming pyramid structures 1001, the electronic material 1002 is formed on the surface of the pyramids 1001. The electronic material 1002 forms the junction with substrate material 1000. To make the pn-junction a dissimilar type (p or n) an electronic material 1002 is to be used. If the substrate 1000 is n-type Si, p-type Si is to be formed as the electronic material 1002. This can be achieved by diffusion of p-dopants into the n-type substrate. The interface of 1001/1002 forms the junction which has the built-in-potential to create the photovoltaic effect in large surface area. Finally, a passivation layer or conformal layer of dielectric or polymer 1007 is formed on the electronic material 1002. Final stages are to make the planarization using insulator layer 1007 and contacts 1003*a* and 1003*b*. Both contacts 1003*a* and 1003*b* can be taken from the back side of the substrate after planarization for completing the solar cell, as shown in FIG. 10F.

FIGS. 11A, 11B, 11C, 11D, and 11E are the schematics showing the fabrication process of the photovoltaic cell using trapezoid structures according to this invention. Like FIG. 10, the fabrication process is the same to make the trapezoidal structures. The only difference with FIG. 6 is that trapezoidal/open pyramids (by selecting the pattern) are made on the substrate. The explanation of the fabrication process the cells is previously explained in FIG. 10, so that repeated explanation is omitted here.

FIGS. 12A, 12B, 12C, 12D, 12E, and 12F are the schematics showing the fabrication process of the photovoltaic cell using cylindrical structures according to this invention. Like FIGS. 10 and 11, the fabrication process flow is the same. The only difference in FIG. 12 is that cylindrical structures are formed on the supporting substrate. In this case, a different orientation from FIGS. 10 and 11 is used. For example, if Si-substrate is used as the supporting substrate, <111> orientation is used in order to achieve a vertically arranged cylindrical structure. The explanation hereafter is previously explained in FIGS. 10 and 11, so that repeated explanation is omitted here. In the cases of FIGS. 10, 11, and 12, the micrometer(s) scaled structures can be made using the standard fabrication processes which should be known to anyone skilled in the art.

FIGS. 13A, 13B, 13C, 13D, and 13E are the schematics showing the fabrication process of the photovoltaic cell comprising nanometer(s) scale rods according to this invention, wherein similar numerals in FIG. 13 represents the same parts in FIG. 12, so that similar explanations are omitted. According to this invention, supporting substrate 1300 can be crystal-Si, Ge, GaAs, or InP.

According to this invention, in way of an example not way of limitation, the supporting substrate 1300 can be Si. Standard silicon oxide 1312 is formed around the substrate 1300 and is used for deposition of Si on deposited Silicon oxide 1312 (glass). After formation of the poly or a-Si 1360 on glass 1312, the silicon substrate can have the smart cut to reuse again. The smart cut can be done using the standard Si-smart-cut in which thinned silicon 1300 can be left. This is followed by the glass 1330 bonding process using the anodic bonding technique. Hoya Glass manufacturer, located in Japan, markets the Glass which has a thermal expansion close to the Si-substrate. Poly silicon can be formed either before or after the smart-cut and bonding processes. This is followed by the formation of the nanometer(s) scale rods 1301 on the Si-epi layer 1360. After formation the nano-sized metals (not shown here) act as a metal catalyst for forming the rods. Using conventional chemical vapor deposition techniques, the rods 1301 can be formed. Electronic material 1302 of opposite type from the rods 1301 is deposited on the surface of the rods 1301. Alternatively, diffusion processes can be used for doping the rods to make the specific (n or p type) semiconductor, for the Si rods case. Note here that Si-layer 1360 and rods 1301 could be the same type (e.g. p or n-type) to make the pn-junction with the electronic material 1302. For making the planarization, conformal deposition of the silicon-oxide or polymer 1307 can be used (not shown here). The final stages are to make the planarization and contacts of 1303*a*, and another on the Si-epi layer (not shown here).

FIGS. 14A, 14B, 14C, 14D, and 14E are the schematics showing the fabrication process of the photovoltaic cell comprising nanometer(s) scaled rods, according to this invention. Like FIG. 13, the nanometer(s) rods 1401 are formed on the electronic material epi-layer 1360 (e.g. Si-epi layer). FIG. 14 and FIG. 13 are substantially similar, but one difference is that the initial substrate is the glass 1430, on which the epi layer of Si 1460 can be grown. In addition, another difference is that the contact of 1403*b* is formed on the glass substrate 1430 prior to forming the epi-layer. Once epi layer 1460 is grown, the processes flow similar to that of FIG. 13, such as formation of the rods 1401, growing of the electronic material 1402 to form the junction 1408 with the semiconductor rods 1401, planarization and also the formation of both contacts 1403*a* and 1403*b*, so that repeated explanation is omitted here.

FIGS. 15A, 15B, 15C, 15D, and 15E are the schematics showing the fabrication process of the flexible photovoltaic cell comprising nanometer(s) scale semiconductor rods, vertically arranged according to this invention. Like FIG. 14, the base substrate 1530 is the glass substrate. It can cover also other polymer (having high glass temperature) type substrates where an epi-layer can be grown. Glass substrate 1530 can have a thickness significant enough to do the process. The growing of the nanometer(s) scaled rods 1501 and electronic material 1502 to form the junction are the same as described in FIG. 14. The only difference in FIG. 15 is that flexible conductive electrical polymer material 1570 is used to embed the nanometer(s) scale rods 1501. Planarization and the formation of the contact layer 1503*a* can be done after embedding the nanometer(s) scaled rods 1501. The glass substrate can be thinned out or completely taken out for enhancing the flexibility. The detailed process is previously explained in FIGS. 10-14, so that repeated explanation is omitted here.

According to this invention, the electronic material formed on the micrometer(s) or nanometer(s) scaled rods, cylinders, trapezoids, and pyramids, explained in FIGS. 6-15, is a single layer used to form the semiconductor pn-junction. The electronic material can be multiple layers to form multiple junctions to capture a wide range of the solar spectrum to increase the power generation.

According to the inventions, as explained in FIGS. 6 thru 15, the pyramids, trapezoids, cylinders, or rods are used to increase the junction so that the junction can be extended closer to the region where the photogenerated carriers are formed. The 3-dimensional (3D) structures (pyramids, trapezoids, cylinders, or rods) can be used as the part of the electronic material to form the junction. This structure can be formed utilizing a suitable substrate. The substrate can be used to form the structure when the junction is formed utilizing the other electronic materials formed on to the 3D structures.

According to this invention, the micrometer(s) scaled pyramid, cylinder, rod, or trapezoid can be made utilizing the orientation of the semiconductor substrate. In this case Si, InP, GAAs, Ge, CdTe, AlN, etc can be used as the substrate.

According to this invention the rods could be GaN materials (n or p type) and the dozens of materials could be $In_{1-x}Ga_xN$ (p or n type, opposite to GaN rods). By increasing the Ga contents, the band-gap of InGaN can be increased to ~3.4 eV, which is the same as that of GaN. By increasing the In contents in InGaN, the band gap can be reduced to ~0.65 eV. Photons with less energy than the band gap slip right through. For example, red light photons are not absorbed by high band-gap semiconductors, while photons with an energy higher than the band gap are absorbed—for example, blue light photons in a low band-gap semiconductor; the excess energy is wasted as heat.

According to this invention, alternatively the rods could be III-V based materials (n or p type), for example InP, and the dozens of the materials could be III-V based material like $In_{1-x}Ga_xAs$ (p or n type, opposite to InP rods). In this case, by adjusting the In contents, the band gap can be tuned and thereby a wide spectrum of solar energy can be absorbed.

According to this invention, alternatively the rods could be II-V based materials (n or p type), for example CdTe, and the dozens of the materials could be II-VI based material like CdZnS (p or n type, opposite to CdTe rods) or Zn(Cd)Te/ZnS based materials. In this case, by adjusting the Zn contents, the band gap can be tuned and thereby a wide spectrum of solar energy can be absorbed.

According to this invention, alternatively the rods could be Si or amorphous Silicon materials (n or p type) and the dozens of the materials could be Si: Ge alloy (p or n type, opposite to Si rods). In this case, by adjusting the Ge contents, the band gap can be tuned and thereby a wide spectrum of solar energy can be absorbed.

According to this invention, alternatively the rods could be Si, InP, or CdTe (n or p type) and dozens of different materials could make the junction with the rods (wires or tubes) and each type of material would have a specific band gap for absorbing a specific range of the solar spectrum. In this way a wide range of the solar spectrum can be absorbed, and by increasing the junction area (due to use of the rods, wires, or tubes), the electrical power generation could be increased tremendously (50 times and beyond).

According to this invention, the nanometer(s)-scale wires, rods or tubes, mentioned in the preferred embodiments, can be any kind of electronic materials, semiconductor, insulator, or metal.

According to this invention, the nanometer sized rods, wires or tubes can be made from semiconductors such as Si, Ge, or compound semiconductors from III-V or II-VI groups. As an example for rods, wires, or tubes, InP, GaAs, or GaN III-V compound semiconductors can be used and they can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

According to this invention, the nanometer sized rods, wires, or tubes based on an II-VI compound semiconductor can also be used. As an example CdTe, CdS, Cdse, ZnS, or ZnSe can be used, and they can be made using standard growth processes, for example, sputtering, evaporation, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers, ceramics such as AlN, Silicon-oxide, or metal etc.

According to this invention, the rods, wire, or tubes, mentioned earlier to make the photovoltaic cell, can be micro or nano scaled and their sides could be vertical or inclined (in shape) at an angle (e.g $\alpha$) with respect to the surface of substrate. Alternatively, the side could be nay shape convenient to manufacturing and increase the surface area. The advantage of using the inclined side is to concentrate the incident light falling onto the side and the gap in between the rods, wires, or tubes.

According to this invention, the nanometer sized rods, wires, or tubes can be made from carbon type materials (semiconductors, insulators, or metal like performances), such as carbon nano-tubes, which could be single or multiple layered. They can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

Although the invention has been described with respect to specific embodiments for complete and clear disclosure, the appended claims are not to be thus limited but are to be construed as embodying all modification and alternative constructions that may occur to one skilled in the art which fairly fall within the basic teaching here is set forth.

The present invention is expected to be found practically useful in that the novel photo-voltaic cells have higher power generation capability (25 times and beyond) when compared with that of the conventional cells. The proposed invention can be used for fabricating wide solar panels for both commercial and space applications.

What is claimed is:

1. A photovoltaic cell comprising:
   a substrate of one material having a top surface and a bottom surface, wherein said top surface is shaped as a plurality of protruding substrate members in a two-dimensional array and gaps formed between said protruding substrate members, thereby increasing the surface area of the top surface,
      wherein the top surface is continuous over the substrate and said protruding substrate members,
      wherein the protruding substrate members are part of the substrate,
      wherein the protruding substrate members are selected from a group of pyramid and a truncated pyramid with a height less than 120 μm and width between 5 nm and 20 μm or a cone and a truncated cone with a height between 500 nm to 10 μm and a width between 5-100 nm, and
      wherein the vertical height of each said protruding substrate members is larger than its base width, thereby concentrating incident solar radiation;
   a first semiconductor material layer conformally and continuously disposed on the said top surface of the said substrate and said protruding substrate members;
   a first electrode; and
   a second electrode,
      wherein said first and second electrodes are connected in such a way as to form a charge separation junction; wherein the bottom surface of said substrate is substantially flat;
      wherein the first electrode is continuously disposed on the bottom surface of the substrate; and
      a layer of dielectric material disposed on the first semiconductor material layer in the gaps between the said protruding structures,
      wherein the second electrode is continuously disposed on the first semiconductor material layer and on the layer of dielectric material.

2. The photovoltaic cell according to claim 1, wherein said first semiconductor material forms a semiconductor junction with the top surface of said substrate.

3. The photovoltaic cell according to claim 1, wherein said semiconductor junction is a metal-semiconductor junction.

4. The photovoltaic cell according to claim 1, wherein said charge separation junction is a p-n junction.

5. The photovoltaic cell according to claim 1, wherein said protruding substrate members are micro-scaled or nano-scaled.

6. The photovoltaic cell according to claim 1, further comprising a transparent passivation material disposed over said first semiconductor material, such that the transparent passivation material fills the gaps between the protruding substrate members and creates a level surface.

7. The photovoltaic cell according to claim 1, further comprising a second semiconductor material disposed conformally over said first semiconductor material, wherein said second semiconductor material has opposite doping from said first semiconductor material.

8. The photovoltaic cell according to claim 1, wherein the substrate is selected from a group consisting of Si, CdTe, GaAs, InP, GaN, Ge, C, ZnO, BN, SiGe, CuInSe, II-VI and III-V.

9. A photovoltaic cell comprising:
   a substrate of one material having a top surface and bottom surface, wherein said top surface is etched to create a plurality of protruding substrate members in a two-dimensional array, thereby increasing the surface area of the top surface,
      wherein the shapes of said protruding substrate members are selected from the group consisting of a pyramid, a truncated pyramid, a cone, and a truncated cone, and
      wherein the vertical height of each said protruding substrate member is larger than its base width, thereby concentrating incident solar radiation;
   a first semiconductor material disposed conformally over the top surface of said substrate;
   a second semiconductor material disposed conformally over said first semiconductor material, wherein said second semiconductor material is doped opposite to said first semiconductor material, thereby forming a semiconductor junction with said first semiconductor material;
   a first electrode electrically connected to said first semiconductor material; and
   a second electrode electrically connected to said second semiconductor material,
      wherein the bottom surface of said substrate is substantially flat,
      wherein the vertical height of each said protruding substrate member is in between 300 nm to 120 μm, and
      wherein the base width of each protruding substrate is in between 5 nm to 20 μm
      wherein the first electrode is continuously disposed on the bottom surface of the substrate; and
      a layer of dielectric material disposed on the second semiconductor material layer in the gaps between the said protruding structures,
      wherein the second electrode is continuously disposed on the second semiconductor material layer and on the layer of dielectric material.

10. The photovoltaic cell according to claim 9, wherein said protruding structures are micro-scaled or nano-scaled.

11. The photovoltaic cell according to claim 9, wherein a passivation material is disposed on said second semiconductor material such that the passivation material fills gaps between said protruding substrate members and creates a level surface.

12. The photovoltaic cell according to claim 9, wherein the substrate is selected from a group consisting of Si, CdTe, GaAs, InP, GaN, Ge, C, ZnO, BN, SiGe, CuInSe, II-VI and III-V.

* * * * *